(12) United States Patent
Moriuchi

(10) Patent No.: US 6,556,637 B1
(45) Date of Patent: Apr. 29, 2003

(54) SEMICONDUCTOR DEVICE HAVING DECISION FEEDBACK EQUALIZER

(75) Inventor: Tsunehiko Moriuchi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 147 days.

(21) Appl. No.: 09/706,716

(22) Filed: Nov. 7, 2000

(30) Foreign Application Priority Data

Mar. 10, 2000 (JP) ........................................ 2000-067397

(51) Int. Cl.⁷ ............................. H04B 1/10; H03H 7/30; G06F 17/10
(52) U.S. Cl. ...................... 375/350; 375/233; 708/323
(58) Field of Search ................................. 375/250, 233, 375/229, 230, 232, 234; 708/300, 319, 322, 323; 333/18, 28 R

(56) References Cited

U.S. PATENT DOCUMENTS

| | | | | |
|---|---|---|---|---|
| 5,455,844 A | * | 10/1995 | Ishikawa et al. ............. | 375/232 |
| 5,703,904 A | * | 12/1997 | Langberg ..................... | 375/232 |
| 6,178,198 B1 | * | 1/2001 | Samueli et al. .............. | 375/214 |
| 6,341,360 B1 | * | 1/2002 | Abdelilah et al. ........... | 375/233 |
| 6,370,191 B1 | * | 4/2002 | Mahant-Shetti et al. .... | 375/233 |

FOREIGN PATENT DOCUMENTS

JP 2000-149458 5/2000

* cited by examiner

*Primary Examiner*—Chi Pham
*Assistant Examiner*—Khai Tran
(74) *Attorney, Agent, or Firm*—Arent Fox Kintner Plotkin & Kahn, PLLC

(57) ABSTRACT

A read channel for a hard disk includes a decision feedback equalizer (DFE) that is used to demodulate and decode a read signal from a read head or a received signal from a fast communication apparatus by eliminating intersymbol interference from sampled data of the read signal. The DFE has a feed forward equalizer (FFE) that filters the sampled data and generates filtered data. An adder is connected to the FFE and adds the filtered data with a feedback signal to generate an equalization signal. A decision unit connected to the adder compares the equalization signal with a reference signal and generates a decision signal. A shift register connected to the decision unit receives the decision signal. A feedback filter connected to the shift register and the adder receives the decision signal from the shift register and generates the feedback signal. The phase and frequency of a clock signal and the phase and frequency of the input signal are matched using the equalization signal and the decision signal. A replica signal generator connected to the shift register supplies a replica signal, which corresponds with a predetermined decision result, to the shift register in place of the decision signal during phase and frequency matching.

21 Claims, 9 Drawing Sheets

SEMICONDUCTOR DEVICE HAVING DECISION FEEDBACK EQUALIZER

BACKGROUND OF THE INVENTION

The present invention relates generally to a semiconductor device, and more particularly, to a semiconductor device having a decision feedback equalizer that is used to demodulate and decode a read signal from the read head of a hard disk unit or a received signal in a fast communication apparatus.

A read channel LSI in a hard disk unit has a waveform equalizer that converts an analog signal, read from a hard disk using a read head, into a digital signal. A reception LSI in a fast communication apparatus has a waveform equalizer that demodulates and decodes a received signal.

As the recording density and the communication speed are increased, a decision feedback equalizer (DFE) that is suitable for fast operation and size reduction becomes more preferred than a PRML (Partial Response and Maximum Likelihood) type waveform equalizer.

The read channel LSI computes a timing error in phase and frequency matching and computes an amplitude error in amplifying the amplitude of an input signal in accordance with the result of a decision made by the decision feedback equalizer. More specifically, a variable gain amplifier in the read channel LSI amplifies the amplitude of the read signal and an A/D converter in the read channel LSI converts the amplified signal into a digital signal. The equalizer has a feed forward filter, an adder, a decision unit, a shift register and a feedback filter. The result of decision on the digital signal made by the decision unit is stored in the shift register whose output is fed back to the adder via a feedback equalizer.

A timing recovery PLL changes the frequency of a sampling clock to the A/D converter in accordance with the equalized output from the decision unit and the decision result from the shift register. A timing recovery loop is therefore formed which changes the frequency of sampling clock supplied to the A/D converter, i.e., changes the frequency of sampling clock in accordance with the output of the A/D converter and feeds the changed sampling clock back to the A/D converter. The timing recovery loop performs the phase and frequency matching such that the sampling clock is accurately synchronized with the read signal.

An amplitude error is computed according to the equalized output and the decision result and a control signal for adjusting the gain of the variable gain amplifier according to the computation result is generated. An auto gain control (AGC) loop is therefore formed which supplies the control signal to the variable gain amplifier. The AGC loop optimizes the gain of the variable gain amplifier such that an analog signal whose amplitude is suitable for the input of the decision feedback equalizer is supplied to the A/D converter.

The decision feedback equalizer executes waveform equalization by feeding back an old decision result stored in the shift register. Therefore, a decision error that occurs one time is likely to be propagated. When an equalization signal y(n) varies due to some factor, such as inadequate phase and frequency matching, as shown in FIG. 1, although the decision result "+1" is accurate, an incorrect decision result "−1" may be generated at time t1. When this decision error is propagated, the decision state cannot be returned to the original, correct decision state. Further, the error propagation affects the error computation.

Such a decision error influences the timing recovery loop and AGC loop. When a(n−1) !=a(n) where y(n) is the equalized output and a(n) is the decision result ("!=" is a symbol for comparison computation (≠)), a timing error TE(n) and an amplitude error AGCerr are acquired from the following equations 1 and 2.

$$TE(n)=(y(n)+y(n-1)) \times a(n-1) \quad (1)$$

$$AGCerr=(|y(n)|-Ref) \quad (2)$$

where Ref is a reference value that is preset in accordance with the amplitude needed to demodulate and decode a read signal.

As error computation is carried out using the decision result from the decision unit in this manner, the result of the timing error computation and the result of the amplitude error computation contain errors. The errors make the timing recovery PLL and AGC loop unstable.

Further, the initial sampling should not necessarily always start at the optimal sampling point or a point close to that optimal sampling point. If the phase of an analog signal is shifted by ±30 degrees with respect to one cycle of preamble data, a computation result having a symbol "+" and a computation result having a symbol "−" alternately appear in the timing error computation. As a result, phase and frequency matching cannot be performed.

When the sample timing is shifted, for example, an incorrect decision result a(n), (+1, +1, −1, −1, −1, −1), not the correct decision result (+1, +1, +1, −1, −1, −1), is generated, thus producing a timing error TE(n) having a symmetrical waveform, as shown in FIG. 2. This timing error TE(n) causes the control amount that leads the phase of the sampling clock to coincide with the control amount that lags the phase of the read signal. This results in pseudo locking which maintains a state in which the phase of the sampling clock is shifted from the phase of the read signal, thus deteriorating the stability of the equalizer.

SUMMARY OF THE INVENTION

Accordingly, it is an object of the present invention to provide a semiconductor device having a decision feedback equalizer that stably performs waveform equalization.

In one aspect of the present invention, a semiconductor device is provided that includes a decision feedback equalizer for generating a decoded signal by eliminating intersymbol interference from sampled data generated by sampling an input signal in accordance with a clock signal. The decision feedback equalizer includes a feed forward filter for filtering the sampled data to generate filtered data, an adder, connected to the feed forward filter, for adding the filtered data and a feedback signal to generate an equalization signal. A decision unit is connected to the adder to compare the equalization signal with a predetermined reference signal to generate a decision signal. A shift register is connected to the decision unit to store the decision signal. A feedback filter is connected to the shift register and the adder to receive the decision signal stored in the shift register and generate the feedback signal. The semiconductor device matches a phase and frequency of the clock signal with a phase and frequency of the input signal using the equalization signal and the decision signal. The semiconductor device includes a replica signal generator that connected to the shift register to supply a replica signal corresponding to a predetermined decision result to the shift register in place of the decision signal at a time of phase and frequency matching.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

Figure 1:
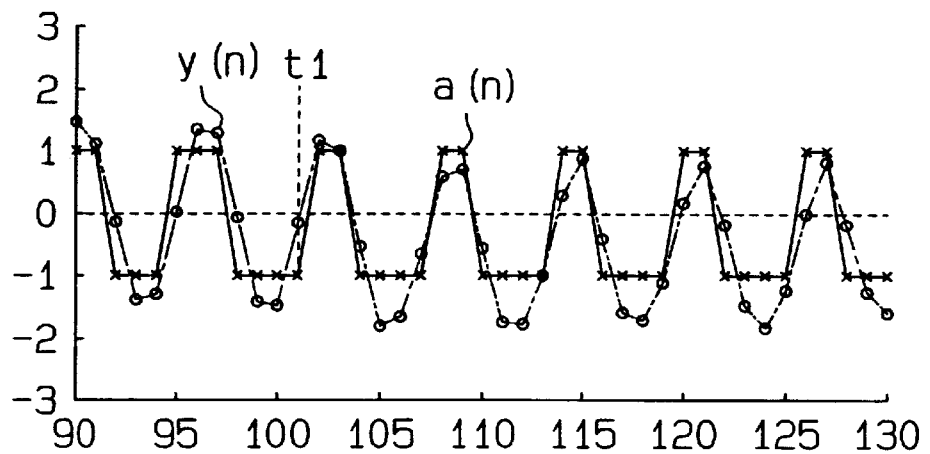
FIG. 1 is a waveform diagram showing the operation of a conventional decision feedback equalizer.
Figure 2:
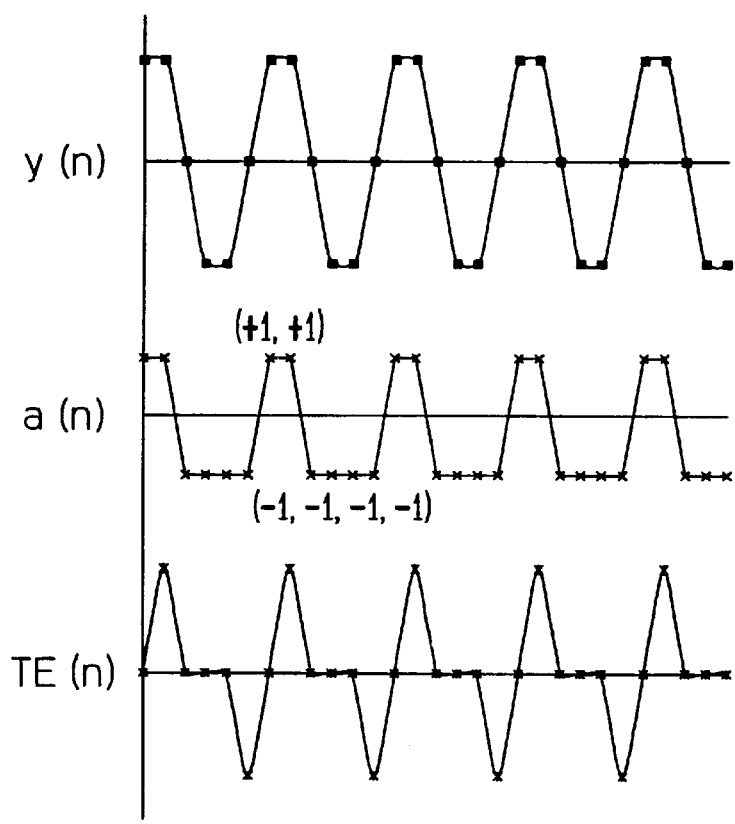
FIG. 2 is another waveform diagram showing the operation of the conventional decision feedback equalizer.
Figure 3:
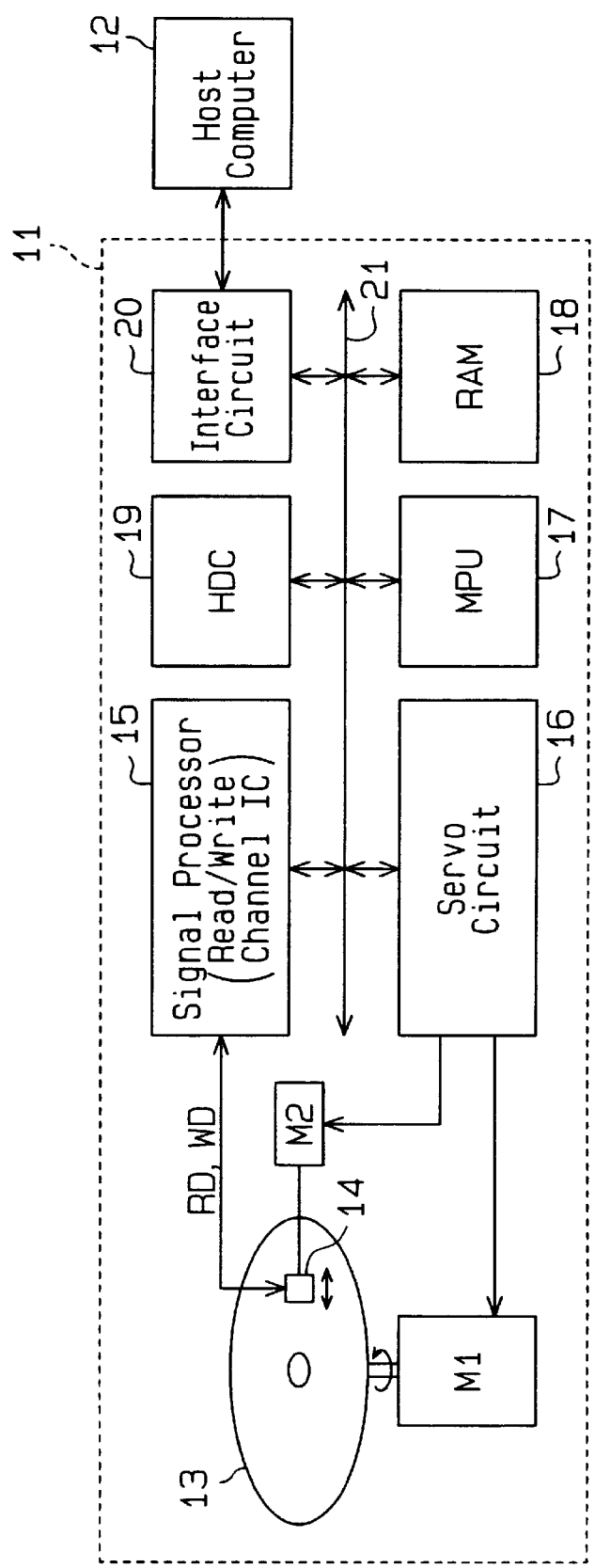
FIG. 3 is a schematic block diagram of a hard disk unit according to one embodiment of the present invention.

FIG. 3 is a schematic block diagram of a hard disk unit 11 having a signal processor 15 according to one embodiment of the present invention. The hard disk unit 11, connected to a host computer 12, records data supplied from the host computer 12 on a magnetic disk 13 in response to a write request from the host computer 12. In response to a read request from the host computer 12, the hard disk unit 11 reads data recorded on the magnetic disk 13 and supplies the data to the host computer 12.

The hard disk unit 11 includes the magnetic disk 13, first and second motors M1 and M2, a head unit 14, the signal processor 15, a servo circuit 16, a microprocessor (MPU) 17, a memory (RAM) 18, a hard disk controller (HDC) 19 and an interface circuit 20, each of which are connected to one another by a bus 21.

The magnetic disk 13 is rotated at a given speed by the first motor M1. The head unit 14 is moved in the radial direction of the magnetic disk 13 by the second motor M2. The head unit 14 reads information recorded on the magnetic disk 13 and generates a read signal RD.

The signal processor 15, which is also called a read/write channel IC, receives the read signal RD from the head unit 14 and samples the read signal RD and converts it to a digital signal. The signal processor 15 performs decoding on the digital signal to generate a decoded signal.

The servo circuit 16 causes the head unit 14 to move to a target track by controlling the second motor M2 based on servo information included in the decoded signal from the signal processor 15 via the bus 21.

The MPU 17 analyzes a write/read command supplied from the host computer 12 in accordance with program data prestored in the RAM 18 and sends a control signal to the HDC 19 via the bus 21. The HDC 19 controls the signal processor 15 and the servo circuit 16 in accordance with the control signal from the MPU 17. The HDC 19 also receives the decoded signal from the signal processor 15 via the bus 21.

The HDC 19 performs error correction on the decoded signal using, for example, an ECC (Error Correcting Code) sector by sector, and sends error-corrected data to the interface circuit 20 via the bus 21.

The HDC 19 receives write data from the host computer 12 via the interface circuit 20, adds error-corrected data to the write data and supplies the resultant write data to the signal processor 15 via the bus 21. The signal processor 15 writes the error corrected write data from the HDC 19 on the magnetic disk 13 via the head unit 14.

Figure 4:
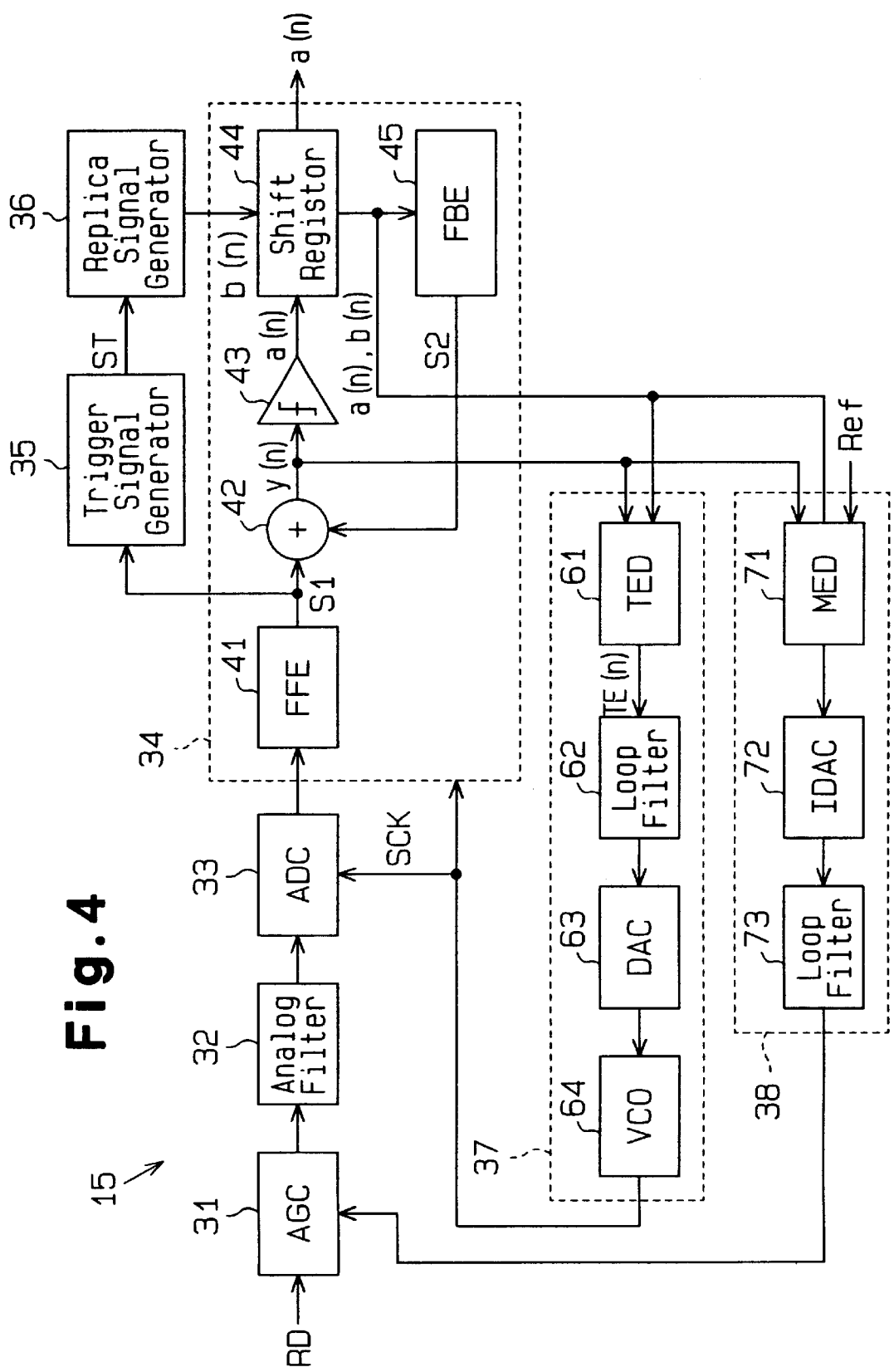
FIG. 4 is a schematic block circuit diagram of a signal processor in the hard disk unit in FIG. 2.

FIG. 4 is a schematic block circuit diagram of a read data demodulating/decoding circuit in the signal processor 15. The signal processor 15 includes an auto gain control amplifier (AGC) 31, an analog filter 32, an analog-digital converter (ADC) 33, a decision feedback equalizer (DFE) 34, a trigger signal generator 35, a replica signal generator 36, a timing recovery circuit 37 and a gain control circuit 38.

The AGC 31 amplifies the read signal RD from the head unit 14 while changing the amplification factor according to the control voltage that is supplied from the gain control circuit 38 and sends the amplified signal to the analog filter 32.

The analog filter 32, which is preferably an anti-aliasing filter having a frequency characteristic suitable for demodulation and decoding, filters the amplified read signal from the AGC 31 to generate a filtered signal. The ADC 33 samples the filtered signal from the analog filter 32 in accordance with a sampling clock SCK supplied from the timing recovery circuit 37, and converts it to a digital signal.

The DFE 34 includes a feed forward equalizer (FFE) 41, an adder 42, a decision unit 43, a shift register 44 and a feedback equalizer (FBE) 45.

The FFE 41, which is preferably a finite impulse response (FIR) filter, receives the digital signal from the ADC 33 and generates a filtered digital signal s(n) (FIG. 4 shows S1) whose waveform maximizes the S/N ratio of the digital signal.

The adder 42 adds the filtered digital signal s (n) from the FFE 41 and a feedback signal S2 from the FBE 45, and generates an equalization signal y(n) having an equalized waveform.

The decision unit 43 receives the equalization signal y(n) from the adder 42, compares the equalization signal y(n) with a predetermined reference value in accordance with the sampling clock SCK and generates a decision signal a(n) that has a decision result "+1" or "−1".

The shift register 44 receives the decision signal a(n) from the decision unit 43 and shifts the decision signal a(n) in synchronism with the sampling clock SCK. Accordingly, the shift register 44 stores plural bits of decision results and sends plural bits of the decision signal a(n) to the FBE 45.

The FBE 45, which is preferably an FIR filter, eliminates intersymbol interference contained in the signal S1 to generate the feedback signal S2. The feedback signal S2 is fed back to the adder 42 to generate the decision signal a(n) that becomes a reproduced signal from which interference from old bits is removed. The signal processor 15 performs decoding on the decision signal a(n) to generate a decoded signal.

The trigger signal generator 35 receives the filtered digital signal s(n) from the FFE 41 and detects if the symbols of plural old bits of the filtered digital signal s(n) meet a predetermined condition. When the symbols match the predetermined condition, a trigger signal ST is activated. According to this embodiment, the trigger signal generator 35 detects if the symbols of six old bits of the filtered digital signal s(n) meet a predetermined condition. The predetermined condition is set by the symbols of data read from a preamble field on the magnetic disk 13. According to this embodiment, the following three conditions are set.

Case 1: +, +, X, −, −, X
Case 2: +, +, X, X, −, −
Case 3: +, +, X, −, −, − where X is either + or −.

The symbols "+++−−−" repeatedly appear in the preamble data read from the preamble field. That is, when the preamble data is read from the preamble field, the trigger signal generator 35 activates the trigger signal ST in accordance with the phase of the preamble data.

Figure 5:
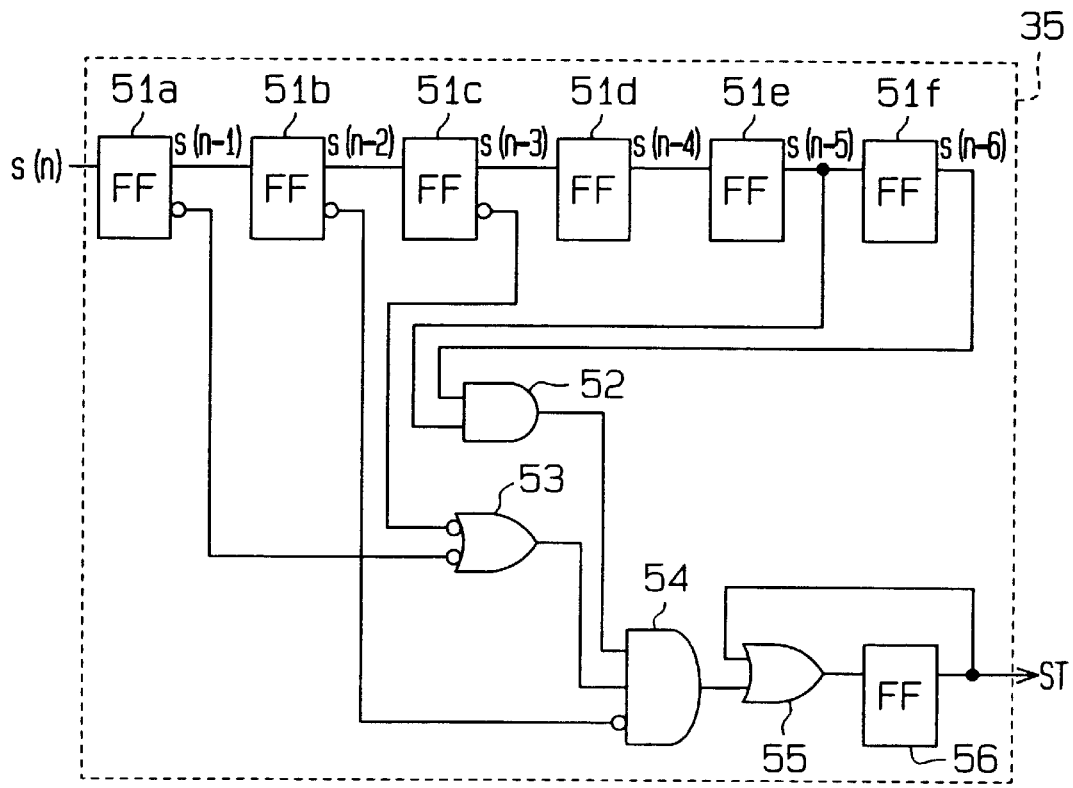
FIG. 5 is a schematic block diagram of a trigger signal generator in the signal processor in FIG. 4.

FIG. 5 is a schematic circuit diagram of the trigger signal generator 35.

The trigger signal generator 35 has flip-flops 51a to 51f whose quantity (six in this embodiment) corresponds to a bit pattern of the preamble signal, an AND gate 52, a NAND gate 53, a 3-input AND gate 54, an OR gate 55 and a flip-flop 56.

The first flip-flop 51a is supplied with the filtered digital signal s(n) from the FFE 41, and the flip-flops 51a–51f latch 6 bits of the filtered digital signal S(n) (i.e., s(n−1) to s(n−6)). The AND gate 52 is supplied with latched signals s(n−5) and s(n−6) from the fifth and sixth flip-flops 51e and 51f. The AND gate 52 outputs an H-level signal when the fifth and sixth bits have an H level (symbol +).

The NAND gate 53 is supplied with inverted signals of the filtered digital signals s(n−1) and s(n−3) from the first and third flip-flops 51a and 51c. The NAND gate 53 outputs an H-level signal when either the first or third bit of the filtered digital signal S(n) has an L level (symbol −).

The AND gate 54 receives the output signal of the AND gate 52, the output signal of the NAND gate 53 and the inverted signal of the filtered digital signal s(n−2) from the second flip-flop 51b, and supplies an H-level signal to the OR gate 55 when the fifth and sixth bits s (n−5) and s (n−6) have an H level, the second bit s(s−2) has an L level and the first or third bit s(n−1) or s(n−3) has an L level.

The OR gate 55 is supplied with the output of the AND gate 54 and the output signal of the flip-flop 56. The output signal of the OR gate 55 is supplied to the flip-flop 56. The flip-flop 56 outputs the trigger signal ST.

Figure 6:
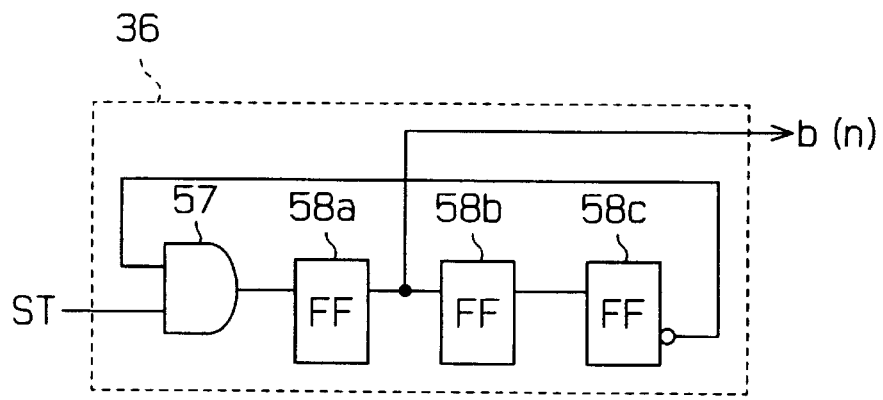
FIG. 6 is a schematic block diagram of a replica signal generator in the signal processor in FIG. 4.

FIG. 6 is a schematic circuit diagram of the replica signal generator 36. The replica signal generator 36 generates the replica signal b(n) in response to the active trigger signal ST from the trigger signal generator 35. The replica signal b(n) has a pattern that matches the pattern of pattern data (preamble data) for setting the amplification factor in the AGC 31 and performing the phase and frequency matching. The preamble data has a pattern which repeats (+1, +1, +1, −1, −1, −1) in this embodiment.

The replica signal generator 36 includes an AND gate 57 and three flop-flops 58a to 58c. The AND gate 57 is supplied with the trigger signal ST and an inverted output signal from the last flip-flop 58c. The output terminal of the AND gate 57 is connected to the data input terminal of the first flip-flop 58a. The first flip-flop 58a outputs the replica signal b(n).

The replica signal generator 36 generates the replica signal b(n) in response to the trigger signal ST triggered in association with the phase of the preamble data. Therefore, the replica signal b(n) has a phase that substantially matches the phase of the preamble signal and a waveform that substantially matches the ideal equalized waveform of the preamble data. The replica signal b(n) is supplied to the shift register 44 in the DFE 34.

Figure 7:
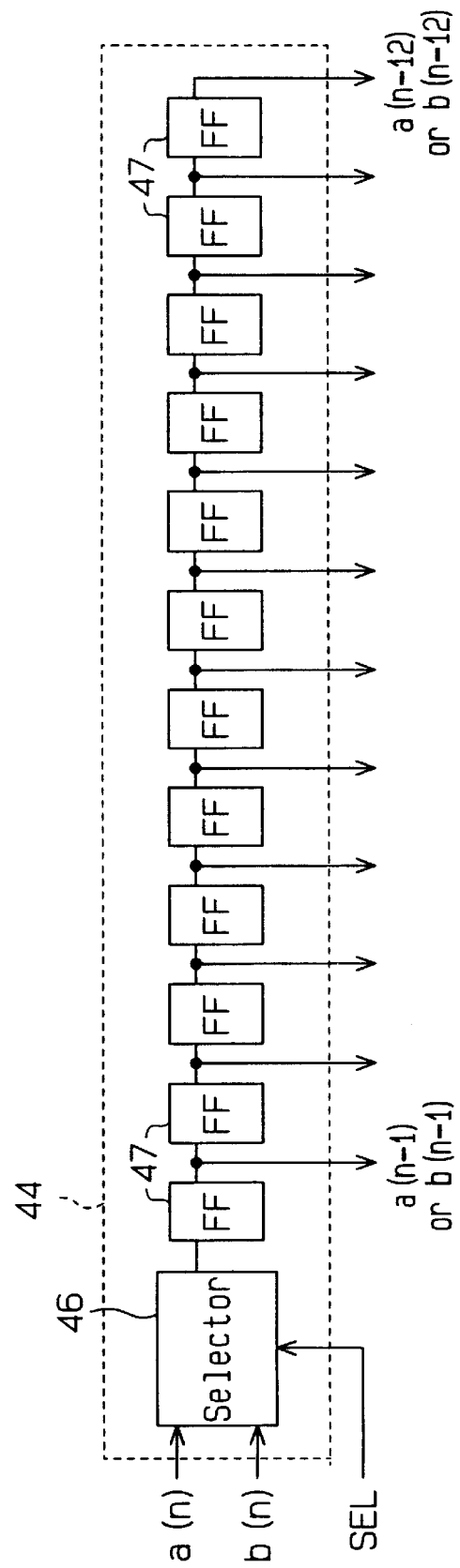
FIG. 7 is a schematic block diagram of a shift register in the signal processor in FIG. 4.

As shown in FIG. 7, the shift register 44 receives the decision signal a(n), the replica signal b(n) and a select signal SEL. The select signal SEL is supplied from the MPU 17. The MPU 17 supplies the shift register 44 with the select signal SEL having a predetermined level (L level in this embodiment) at the preamble time at which the amplification factor in the AGC 31 is set and the phase and frequency matching is performed, and supplies an H-level select signal SEL in a period where sync byte data and user data are read.

The shift register 44 includes a selector 46 and plural (12 in this embodiment) flip-flops 47 connected in series. The selector 46 is supplied with the decision signal a(n) from the decision unit 43 and the replica signal b(n) from the replica signal generator 36. The selector 46 selects the decision signal a(n) in response to the H-level select signal SEL and selects the replica signal b(n) in response to the L-level select signal SEL. The selector 46 outputs the selected decision signal a(n) or replica signal b(n). The plural flip-flops 47 latch the signal selected by the selector 46 in accordance with the sampling clock SCK that is supplied to each flip-flop 47.

In other words, the shift register 44 shifts the replica signal b(n) in accordance with the sampling clock SCK in response to the L-level select signal SEL, and shifts the decision signal a(n) in accordance with the sampling clock SCK in response to the H-level select signal SEL. Therefore, the shift register 44 supplies plural bits of the replica signal b(n) to the FBE 45 at the time of supplying the preamble pattern, and supplies plural bits of the decision signals a(n) to the FBE 45 when sync byte data and user data are being read.

At the time of supplying the preamble pattern, the feedback signal S2 based on the replica signal b(n) is fed back to the adder 42. As the feedback signal S2 originates from the replica signal b(n), and does not contain a decision error of the decision signal a(n). This prevents error propagation in the loop of the DFE 34 from taking place due to a decision error at the time of supplying the preamble pattern.

The decision signal a(n) or the replica signal b(n) from the shift register 44 is supplied to the timing recovery circuit 37 and the gain control circuit 38.

Returning to FIG. 4, the timing recovery circuit 37 includes a timing error detector (TED) 61, a loop filter 62, a digital-analog converter (DAC) 63 and a voltage controlled oscillator (VCO) 64.

The TED 61 receives the equalization signal y(n) and the decision signal a(n) (or the replica signal b(n)). When the symbol of the decision signal a(n) (or the replica signal b(n)) differs from the symbol of the decision signal a(n−1) (or the replica signal b(n−1)) by one sample, the TED 61 detects a timing error between the equalization signal y(n) and the decision signal a(n) and generates a timing error signal TE(n).

Figure 8:
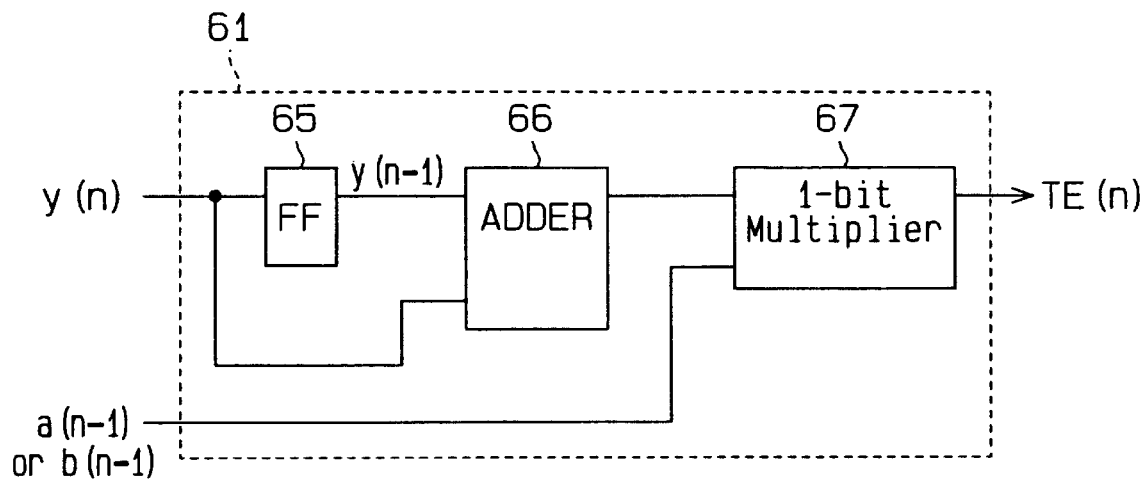
FIG. 8 is a schematic block diagram of a timing recovery circuit in the signal processor in FIG. 4.

As shown in FIG. 8, the TED 61 includes a flip-flop 65, an adder 66 and a multiplier 67. The flip-flop 65 latches the equalization signal y(n) and sends the latched signal (i.e., the equalization signal y(n−1)) to the adder 66. The adder 66 adds the equalization signal y(n) and the equalization signal y(n−1) and sends a resultant added signal to the multiplier 67. The multiplier 67, which is preferably a 1-bit multiplier, multiplies the added signal from the adder 66 by the decision signal a(n−1) (or the replica signal b(n−1)), to generate the timing error signal TE(n).

Specifically, when the replica signal b(n) shows a relationship of b(n−1) !=b(n) ("!=" is a symbol for comparison computation (...) ) at the time of supplying the preamble pattern, the TED 61 acquires the timing error TE(n) from the following equation 3.

$$TE(n)=(y(n)+y(n-1))\times b(n-1) \quad (3)$$

Returning to FIG. 4, the loop filter 62, filters the timing error signal TE(n) supplied from the TED 61, thus generating a filtered error signal. The DAC 63 generates a control voltage corresponding to the filtered error signal. The VCO 64 supplies the sampling clock SCK, which has a frequency according to the control voltage, to the ADC 33 and the DFE 34.

The ADC 33, the DFE 34 and the timing recovery circuit 37 form a timing recovery PLL which locks the frequency of the sampling clock SCK to the frequency of the read signal RD based on a phase error between the equalization signal and the decision result. At the time of supplying the preamble pattern, the replica signal b(n) free of a decision error is supplied to the timing recovery circuit 37. Therefore, the timing recovery PLL operates stably at the time of supplying the preamble pattern.

The gain control circuit 38 includes an amplitude error detector (MED) 71, a digital-analog converter (IDAC) 72 and a loop filter 73.

The MED 71 receives the equalization signal y(n), the decision signal a(n) (or the replica signal b(n) ) and a reference signal Ref. When the symbol of the decision signal a(n) (or the replica signal b(n)) differs from the symbol of the decision signal a(n−1) (or the replica signal b(n−1)), the MED 71 compares the equalization signal y(n) with the reference signal Ref and generates an amplitude error signal AGCerr.

Figure 9:
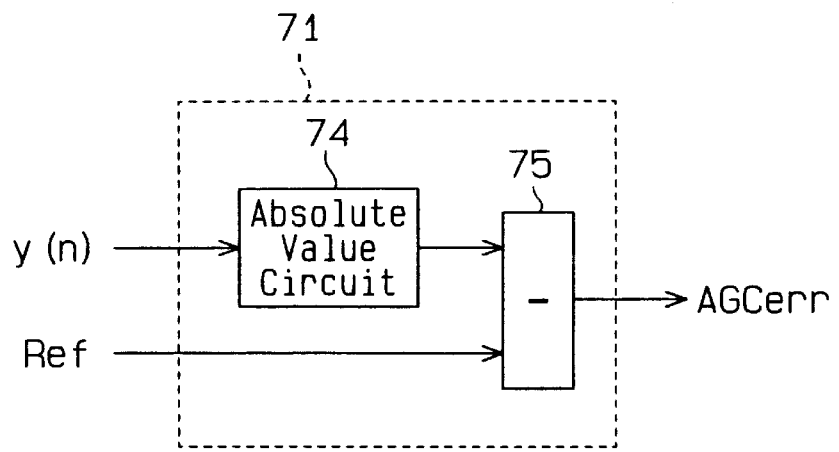
FIG. 9 is a schematic block diagram of a gain control circuit in the signal processor in FIG. 4.

As shown in FIG. 9, the MED 71 includes an absolute value circuit 74 and a subtracter 75. The absolute value circuit 74 obtains the absolute value of the equalization signal y(n) and generates an absolute value signal. The subtracter 75 subtracts the reference signal Ref from the absolute value signal from the absolute value circuit 74, thus generating the amplitude error signal AGCerr.

Specifically, when the replica signal b(n) shows a relationship of b(n−1) !=b(n) ("!=" is a symbol for comparison computation (...)) at the time of supplying the preamble pattern, the MED 71 acquires the amplitude error AGCerr from the following equation 4.

$$AGCerr=(|y(n)|-Ref) \quad (4)$$

Returning to FIG. 4, the IDAC 72 converts the amplitude error signal AGCerr into a digital signal. The loop filter 73 filters the digital signal from the IDAC 72 to generate a control voltage. The AGC 31 operates with the gain that corresponds to the control voltage from the loop filter 73.

As apparent from the above, the AGC loop optimizes the gain of the AGC 31 based on an amplitude error between the equalization waveform and the decision result in such a way that the output signal of the AGC 31 has the optimal amplitude. At the time of supplying the preamble pattern, the replica signal b(n) free of a decision error is supplied to the gain control circuit 38. Therefore, the AGC loop is stabilized at the time of supplying the preamble pattern.

The operation of the signal processor 15 will now be discussed referring to FIGS. 10 to 14.

Figure 10:
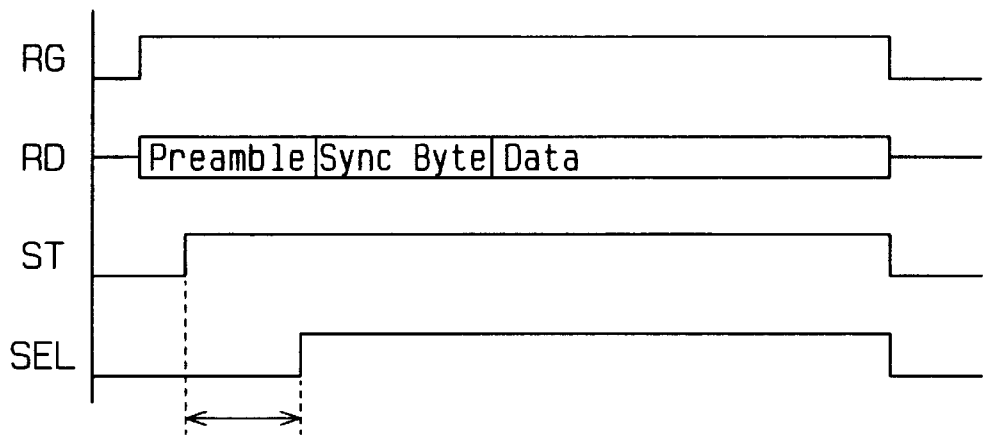
FIG. 10 is a timing chart for explaining data reading.

When the MPU 17 activates a read start signal RG, the signal processor 15 reads data from a predetermined sector on the magnetic disk 13. At the time of reading data, as shown in FIG. 10, the read period for preamble data is set as a preamble field, the read period for sync byte data is set as a sync byte field, and the read period for user data is set as a data field. The MPU 17 sends the H-level select signal SEL to the shift register 44 during a period from before the sync byte field to the data field.

Figure 11:
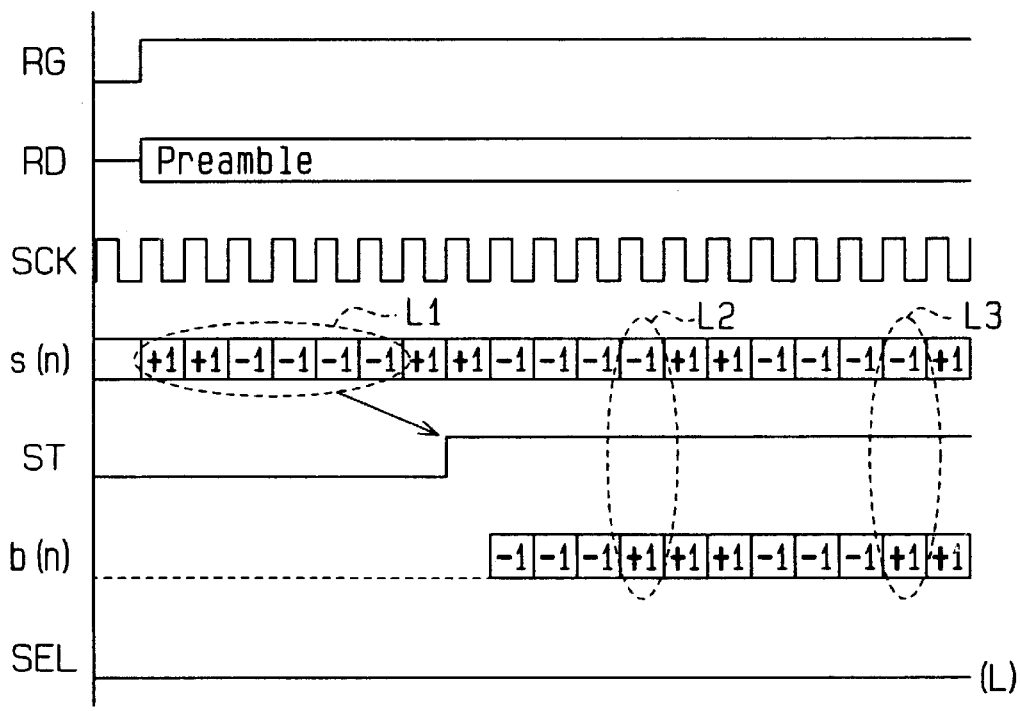
FIG. 11 is a timing chart illustrating the operation of the signal processor of FIG. 4.

Because a sequence of bits of the signal s(n) from the FFE 41 (the bit sequence encircled by a broken line L1) satisfies a predetermined symbol condition (case 3) in the preamble field, as shown in FIG. 11, the trigger signal generator 35 activates the trigger signal ST. In response to the activated trigger signal ST, the replica signal generator 36 generates the replica signal b(n) which repeats the pattern of "−1, −1, −1, +1, +1, +1". A decision error occurs in the replica signal b(n) as indicated by broken lines L2 and L3 when the loop is not stable. A symbol "+1" is assigned in place of the symbol "−1" of the filtered digital signal s(n) from the FFE 41. The use of this replica signal allows the timing recovery circuit 37 and the gain control circuit 38 to ideally execute error computation at substantially the same timing as the read signal RD originated from the preamble pattern. Therefore, the timing recovery PLL operates stably and locks the frequency of the sampling clock SCK to the frequency of the read signal RD. Further, the AGC loop operates stably and generates the read signal RD having the desired amplitude.

Figure 12:
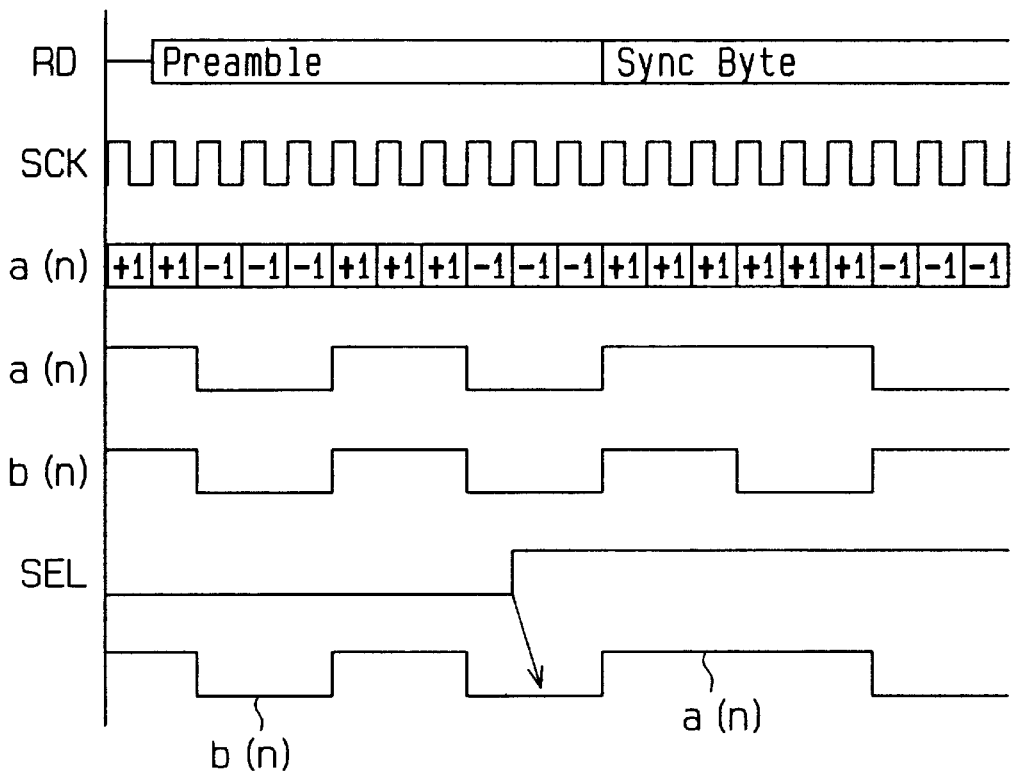
FIG. 12 is a timing chart illustrating the operation of a preamble field and a sync byte period in the signal processor of FIG. 4.

When the select signal SEL changes from L level to an H level, as shown in FIG. 12, the shift register 44 shifts the decision signal a(n) in place of the replica signal b(n).

Figure 13:
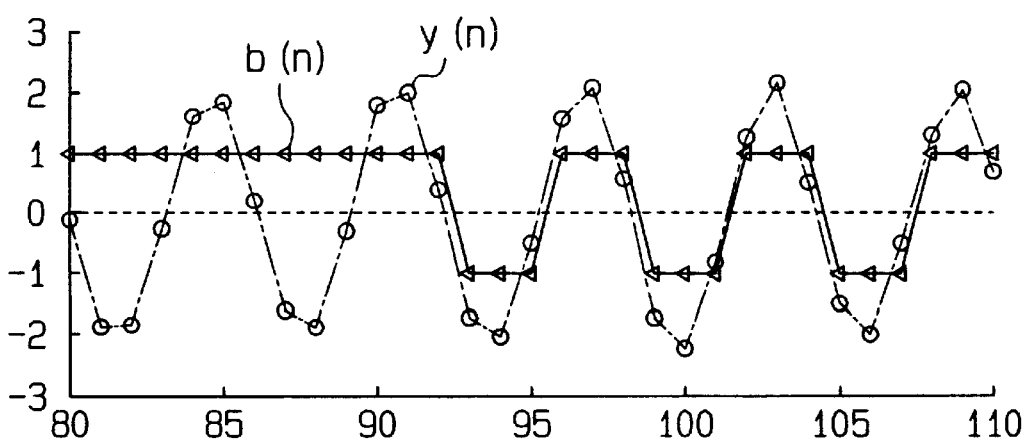
FIG. 13 is a waveform diagram showing an equalization signal and replica signal according to the present invention.

FIG. 13 shows the waveforms of the equalization signal y(n) and the replica signal b(n) at each sampling point. The use of the replica signal b(n) this way prevents propagation of an error contained in the equalization signal y(n).

Figure 14:
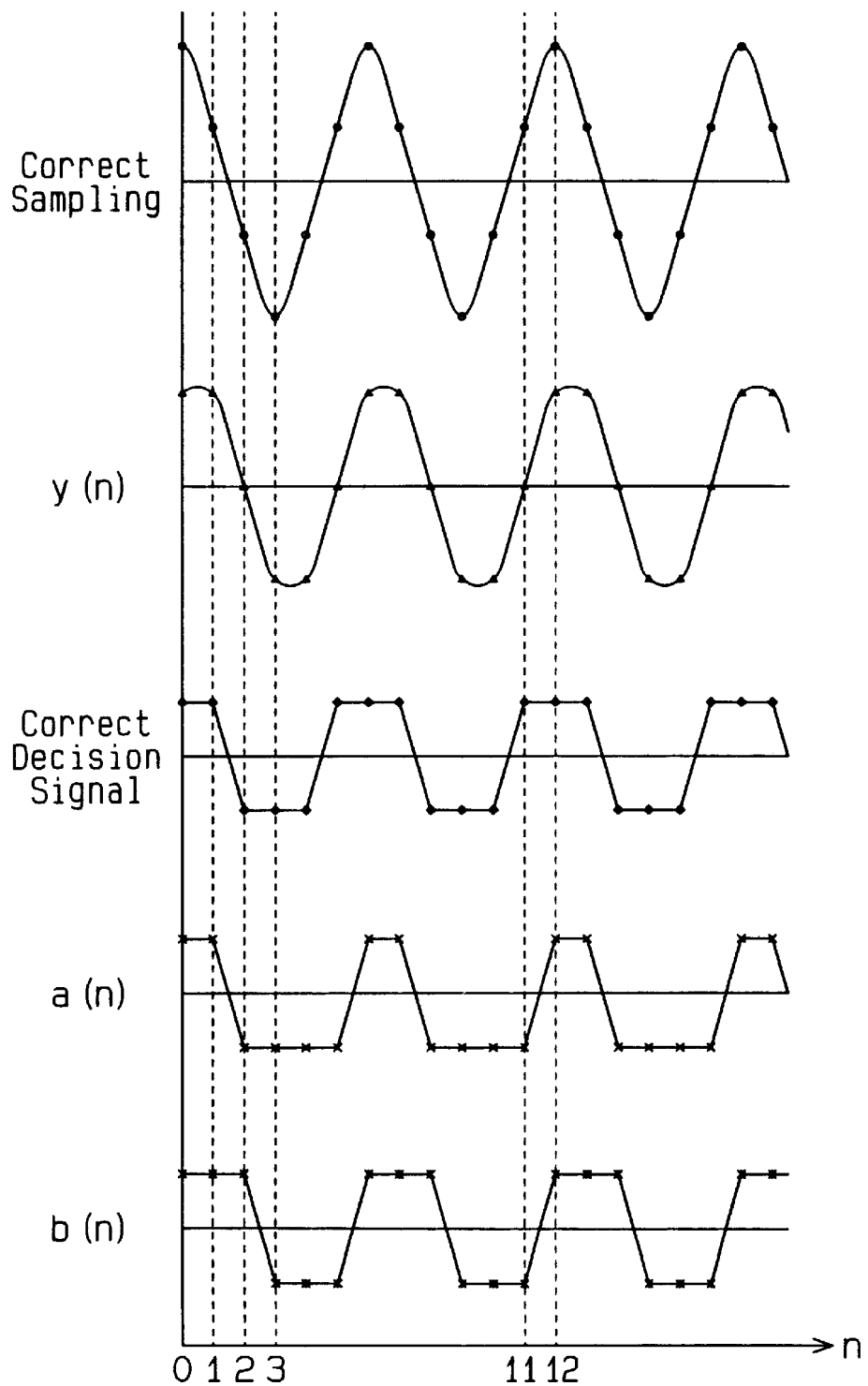
FIG. 14 is a waveform diagram for explaining the operation of the signal processor in FIG. 4.

FIG. 14 shows a waveform indicating the correct sampling points, the waveform of the equalization signal y(n), the waveform of the correct decision signal, the waveform of the decision signal a(n) containing a decision error and the waveform of the replica signal b(n).

When phase errors at points n=3, 12 where the symbols of the replica signals b(n) and b(n−1) change are detected by using the replica signal b(n), $$TE(3)=(y(3)+y(2))\times b(2)<0.$$

$$TE(12)=(y(12)+y(11))\times b(11)<0.$$

In this case, the symbols of two phase errors TE(3) and TE(12) are both negative, the timing recovery circuit 37 operates in such a way that the frequency of the sampling clock SCK coincides with the frequency of the read signal RD.

When phase errors at points n=3, 12 are detected using the decision signal a(n) from the decision unit 43, in contrast, $$TE(3)=(y(3)+y(2))\times a(2)>0,$$

$$TE(12)=(y(12)+y(11))\times a(11)<0.$$

In this case, the symbols of the phase errors TE(3) and TE(12) differ from each other, the timing recovery circuit 37 goes to a pseudo lock state where the frequency of the sampling clock SCK is not changed.

The signal processor 15 of this embodiment has the following advantages.

(1) The signal processor 15 performs the phase and frequency matching using, instead of the decision signal a(n), the replica signal b(n) that corresponding to a predetermined decision result. This prevents the propagation of a decision error at the time of matching the phase and frequency, so that waveform equalization in the decision feedback equalizer is carried out stably.

(2) The timing recovery circuit 37 generates the sampling clock SCK in accordance with the equalization signal y(n) and replica signal b(n) at the time of matching the phase and frequency. This prevents pseudo locking from occurring due to a decision error at the time of matching the phase and frequency.

(3) The timing recovery circuit 37 has the timing error detector (TED) 61 which computes the timing error TE(n) between the replica signal b(n) (or the decision signal a(n)) and the equalization signal y(n) at a predetermined timing according to the replica signal b(n) at the time of matching the phase and frequency. Based on the computation result, the timing recovery circuit 37 changes the frequency of the sampling clock SCK. Therefore, the timing error at the time of matching the phase and frequency is computed accurately, thus shortening the time of matching the phase and frequency.

(4) At the time of matching the phase and frequency, the gain control circuit 38 generates a gain control signal for the AGC 31 in accordance with the equalization signal y(n) and the replica signal b(n). At the time of matching the phase and frequency, therefore, an amplified analog signal having the desired amplitude is generated.

(5) The gain control circuit 38 has the amplitude error detector (MED) 71 which computes the amplitude error AGCerr by comparing the equalization signal y(n) with a predetermined reference signal at a predetermined timing according to the replica signal b(n) at the time of matching the phase and frequency. Based on the computation result, the gain control circuit 38 generates a control signal, so that an amplitude error at the time of matching the phase and frequency is computed accurately.

(6) The trigger signal generator 35 determines if the output signal s(n) of the FFE 41 coincides with a predetermined condition, and generates the trigger signal ST based on the decision result. In response to the trigger signal ST, the replica signal generator 36 generates the replica signal b(n) corresponding to a predetermined decision result. As a result, the replica signal b(n) can be generated at the input timing for the input signal at the time of matching the phase and frequency, thus ensuring reliable matching of the phase and frequency.

It should be apparent to those skilled in the art that the present invention may be embodied in many other specific forms without departing from the spirit or scope of the invention. Particularly, it should be understood that the invention may be embodied in the following forms.

The trigger signal generator 35 and the replica signal generator 36 are merely illustrated separately in accordance with their functions. Therefore, the trigger signal generator 35 and the replica signal generator 36 may be replaced with one block circuit or three or more block circuits which can generate the replica signal b(n) at the proper timing using the signal s(n) from the FFE 41.

The present invention may be adapted to a signal processor for abase band digital communication system as well as the signal processor 15 in the hard disk unit. Therefore, the present examples and embodiments are to be considered as illustrative and not restrictive and the invention is not to be limited to the details given herein, but may be modified within the scope and equivalence of the appended claims.

What is claimed is:

1. A semiconductor device comprising:
    a decision feedback equalizer for generating a decoded signal from sampled data generated by sampling an input signal in accordance with a clock signal, the decision feedback equalizer including a shift register for receiving the decision signal; and
    a replica signal generator, connected to the shift register, for supplying a replica signal corresponding to a predetermined decision result to the shift register in place of the decision signal at a time when a phase and frequency of the clock signal matches with a phase and frequency of the input signal.

2. The semiconductor device according to claim 1, wherein the predetermined decision result includes a preamble pattern.

3. The semiconductor device according to claim 1, further comprising a trigger signal generator for generating a trigger signal on the basis of the input signal to control a generation of the replica signal by the replica signal generator.

4. The semiconductor device according to claim 3, wherein the decision feedback equalizer includes a feed forward filter for filtering the sampled data to generate filtered data, the trigger signal generator generates the trigger signal when the filtered data meets a predetermined condition, and wherein the predetermined condition includes a symbol condition for a preamble pattern and the predetermined decision result includes the preamble pattern.

5. The semiconductor device according to claim 4, wherein the symbol condition for the preamble pattern is one of three symbol conditions for the preamble pattern.

6. The semiconductor device according to claim 1, wherein the decision feedback equalizer includes:
    a feed forward filter for filtering the sampled data to generate filtered data,
    a adder, connected to the feed forward filter, for adding the filtered data and a feedback signal to generate an equalization signal,
    a decision unit, connected to the adder, for comparing the equalization signal with a predetermined reference signal to generate a decision signal, the device further comprising:
    an A/D converter, connected to the feed forward filter, for sampling the input signal in accordance with the clock signal to generate the sampled data; and
    a timing recovery circuit, connected to the A/D converter, the adder and the shift register, for generating the clock signal using the equalization signal and the decision signal and supplying the clock signal to the A/D converter, wherein at a time of phase and frequency matching, the timing recovery circuit generates the clock signal using the equalization signal and the replica signal.

7. The semiconductor device according to claim 6, wherein at the time of phase and frequency matching, the timing recovery circuit computes a timing error between the replica signal and the equalization signal and changes the frequency of the clock signal in accordance with the timing error.

8. The semiconductor device according to claim 6, further comprising:

an amplifier for amplifying the input signal in accordance with a predetermined gain and supplying the amplified input signal to the A/D converter; and a gain control circuit, connected to the amplifier, the adder and the shift register, for generating a control signal for controlling the predetermined gain of the amplifier using the equalization signal and the decision signal, wherein at the time of phase and frequency matching, the gain control circuit generates the control signal using the equalization signal and the replica signal.

9. The semiconductor device according to claim 8, wherein at the time of phase and frequency matching, the gain control circuit computes an amplitude error by comparing the equalization signal with the predetermined reference signal and generates the control signal in accordance with the amplitude error.

10. The semiconductor device according to claim 1, wherein the decision feedback equalizer includes a decision unit, connected to the shift register, for comparing the equalization signal with a reference signal to generate a decision signal.

11. The semiconductor device according to claim 1, wherein the decision feedback equalizer includes;
a feed forward filter for filtering the sampled data;
an adder, connected to the feed forward filter, for adding the filtered data and a feedback signal to generate an equalization signal; and
a feedback filter, connected to the shift register and the adder, for receiving the decision signal and generating the feedback signal.

12. The semiconductor device according to claim 1, further comprising a selector, connected to the shift register, for selecting one of the decision signal and the replica signal.

13. The semiconductor device according to claim 3, wherein the trigger signal generator determines if the sampled data meets a predetermined condition and generates the trigger signal when the sampled data meets the predetermined condition.

14. A signal processing system comprising:
an amplifier for amplifying an input signal in accordance with a predetermined gain and generating an amplified input signal;
an A/D converter, connected to the amplifier, for sampling the amplified input signal in accordance with the clock signal and generating a sampled data;
a decision feedback equalizer, connected to the A/D converter, for generating a decoded signal by eliminating intersymbol interference from the sampled data, the decision feedback equalizer including,
a feed forward filter for filtering the sampled data to generate filtered data,
an adder, connected to the feed forward filter, for adding the filtered data and a feedback signal to generate an equalization signal,
a decision unit, connected to the adder, for comparing the equalization signal with a predetermined reference signal to generate a decision signal,
a shift register, connected to the decision unit, for storing the decision signal, and
a feedback filter, connected to the shift register and the adder, for receiving the decision signal stored in the shift register and generating the feedback signal;
a replica signal generator, connected to the shift register, for supplying a replica signal corresponding to a predetermined decision result to the shift register in place of the decision signal at a time of phase and frequency matching;

a timing recovery circuit, connected to the A/D converter, the adder and the shift register, for generating the clock signal using the equalization signal and the decision signal and supplying the clock signal to the A/D converter, wherein the timing recovery circuit matches a phase and frequency of the clock signal with a phase and frequency of the input signal using the equalization signal and the decision signal and wherein at a time of phase and frequency matching, the timing recovery circuit generates the clock signal using the equalization signal and the replica signal; and a gain control circuit, connected to the amplifier, the adder and the shift register, for generating a control signal for controlling the predetermined gain of the amplifier using the equalization signal and the decision signal, wherein at the time of phase and frequency matching, the gain control circuit generates the control signal using the equalization signal and the replica signal.

15. A semiconductor device comprising:
a decision feedback equalizer for generating a decision signal from sampled data generated by sampling an input signal in accordance with a clock signal;
a replica signal generator, connected to the decision feedback equalizer, for generating a replica signal corresponding to a predetermined decision result at a time when a phase and frequency of the clock signal matches with a phase and frequency of the input signal; and
a selector, connected to the replica signal generator, for selecting one of the decision signal and the replica signal.

16. The semiconductor device according to claim 15, wherein the decision feedback equalizer includes a shift register, connected to the selector, for receiving and shifting one of the decision signal and the replica signal.

17. The semiconductor device according to claim 15, further comprising a trigger signal generator for generating a trigger signal on the basis of the input signal to control a generation of the replica signal by the replica signal generator.

18. A semiconductor device comprising:
a decision feedback equalizer for generating a decoded signal by eliminating intersymbol interface from sampled data generated by sampling an input signal in accordance with a clock signal, the decision feedback equalizer including,
a feed forward filter for filtering the sampled data to generate filtered data,
an adder, connected to the feed forward filter, for adding the filtered data and a feedback signal to generate an equalization signal,
a decision unit, connected to the adder, for comparing the equalization signal with a predetermined reference signal to generate a decision signal,
a shift register, connected to to the decision unit, for storing the decision signal, and
a feedback filter; connected to the shift register and the adder, for receiving the decision signal stored in the shift register and generating the feedback, wherein the semiconductor device matches a phase and frequency of the clock signal with a phase and frequency of the input signal using the equalization signal and the decision signal; and
a replica signal generator, connected to the shift register, for supplying a replica signal corresponding to a predetermined decision result of the shift register in place of the decision signal at a time of phase and frequency matching.

19. A method for executing a waveform equalization, comprising:

sampling an input signal in accordance with a clock signal to generate sampled data;

generating a decision signal from the sampled data;

generating a feedback signal on the basis of the decision signal;

generating an equalization signal on the basis of the feedback signal; and generating a replica signal corresponding to a predetermined decision result at a time when a phase and frequency of the clock signal matches with a phase and frequency of the imput signal.

20. The method according to claim 19, further comprising selecting one of the decision signal and the replica signal.

21. A method for controlling a decision feedback equalizer, comprising:

sampling an input signal in accordance with a clock signal to generate sampled data;

generating a decision signal from the sampled data;

generating a replica signal corresponding to a predetermined decision result at a time when a phase and frequency of the clock signal matches with a phase and frequency of the input signal; and selecting one of the decision signal and the replica signal to generate an equalization signal.

* * * * *